United States Patent [19]
Long et al.

[11] Patent Number: 5,229,923
[45] Date of Patent: Jul. 20, 1993

[54] CIRCUIT SUPPORTING SUBSTRATE MOUNTING AND RETAINING ARRANGEMENT

[75] Inventors: Christopher R. Long, Boca Raton; Melvin Teitzman, Boynton Beach, both of Fla.

[73] Assignee: Motorola, Inc., Schaumburg, Ill.

[21] Appl. No.: 560,411

[22] Filed: Jul. 30, 1990

[51] Int. Cl.⁵ .......................... H05K 5/00; H05K 7/14
[52] U.S. Cl. ........................ 361/415; 361/399
[58] Field of Search .............. 361/395, 399, 415, 417, 361/420; 211/41; 439/64, 76, 532, 545, 562

[56] References Cited

U.S. PATENT DOCUMENTS

| | | | |
|---|---|---|---|
| 4,716,497 | 12/1987 | Craker | 361/395 |
| 4,764,847 | 8/1988 | Eisenblätter et al. | 361/420 X |
| 4,779,744 | 10/1988 | Shely et al. | 211/41 |
| 4,794,488 | 12/1988 | Belanger, Jr. | 361/395 |
| 5,016,142 | 5/1991 | White | 361/415 |

FOREIGN PATENT DOCUMENTS 2533400 3/1984 France ................. 361/415

*Primary Examiner*—Leo P. Picard
*Assistant Examiner*—Donald Sparks
*Attorney, Agent, or Firm*—Jose Gutman; William E. Koch; Thomas G. Berry

[57] ABSTRACT

An electronic device includes a circuit supporting substrate (104) capable of being partially flexed at one end, and a housing (100) having a retainer (102) for receiving the circuit supporting substrate into the retainer (102) in a first direction and for securing the circuit supporting substrate (104) within the retainer (102) via fastenerless sliding engagement in a second direction. The retainer (102) includes at least one retaining stop (108) arranged such that the one end of the circuit supporting substrate (104) contacts the at least one retaining stop (108) to partially flex the circuit supporting substrate (104) at the one end while the circuit supporting substrate (104) is received in the retainer (102).

8 Claims, 2 Drawing Sheets

5,229,923

CIRCUIT SUPPORTING SUBSTRATE MOUNTING AND RETAINING ARRANGEMENT

FIELD OF THE INVENTION

This invention relates in general to the field of housings for electronic devices, and more specifically to those housings with fastenerless retaining means for securing circuit supporting substrates.

BACKGROUND OF THE INVENTION

Most conventional housings for electronic communication devices (e.g., communication receivers, transmitters, and paging terminals), incorporate the electronic circuits via some form of circuit supporting substrate (e.g., printed circuit board). The circuit supporting substrate is typically secured to the housing with fasteners and associated hardware. Usually, one or more screws are driven through apertures in the circuit supporting substrate and secured to the housing using corresponding nuts and washers.

In some housing arrangements, molded-in hooks are moved or deflected to insert or remove the circuit supporting substrate. Usually, molded hooks are prone to overstress failures and have a limited number of operations (insertions and withdrawals of the circuit supporting substrate) prior to damage or destruction. Moreover, designing for sufficient deflection to prevent overstressing may be impossible in confined areas when using extremely stiff materials, such as structural foam, due to the long moment arm required.

Unfortunately, securing the circuit supporting substrate to the housing using only the above described conventional techniques detrimentally affects the manufacturability and serviceability of the electronic device. Moreover, the additional parts and additional assembly steps add manufacturing cost to the product. Also, due to the increased opportunities for introducing defects during manufacturing and assembly, the quality of the product as perceived by the consumer is seriously degraded. Lastly, servicing the product requires additional assembly and disassembly steps, which increases the time and cost for service and repair. Accordingly, a need exists for a retaining arrangement to effectively improve this situation.

SUMMARY OF THE INVENTION

In carrying out one form of this invention there is provided an electronic device comprising a circuit supporting substrate capable of being partially flexed at one end, and a housing having retaining means for receiving the circuit supporting substrate into the retaining means in a first direction and for securing the circuit supporting substrate within the retaining means via fastenerless sliding engagement in a second direction. The retaining means includes at least one retaining stop arranged such that the one end of the circuit supporting substrate contacts the at least one retaining stop to partially flex the circuit supporting substrate at the one end while the circuit supporting substrate is received in the retaining means.

In a second aspect of the present invention, an electronic device comprises a circuit supporting substrate, a housing having retaining means for receiving the circuit supporting substrate into the retaining means in a first direction and for securing the circuit supporting substrate within the retaining means via fastenerless sliding engagement in a second direction, and a compression means coupled to the housing, the circuit supporting substrate compressing the compression means while receiving the circuit supporting substrate in the retaining means, for compressibly securing the circuit supporting substrate to the housing.

DESCRIPTION OF A PREFERRED EMBODIMENT

Figure 1:
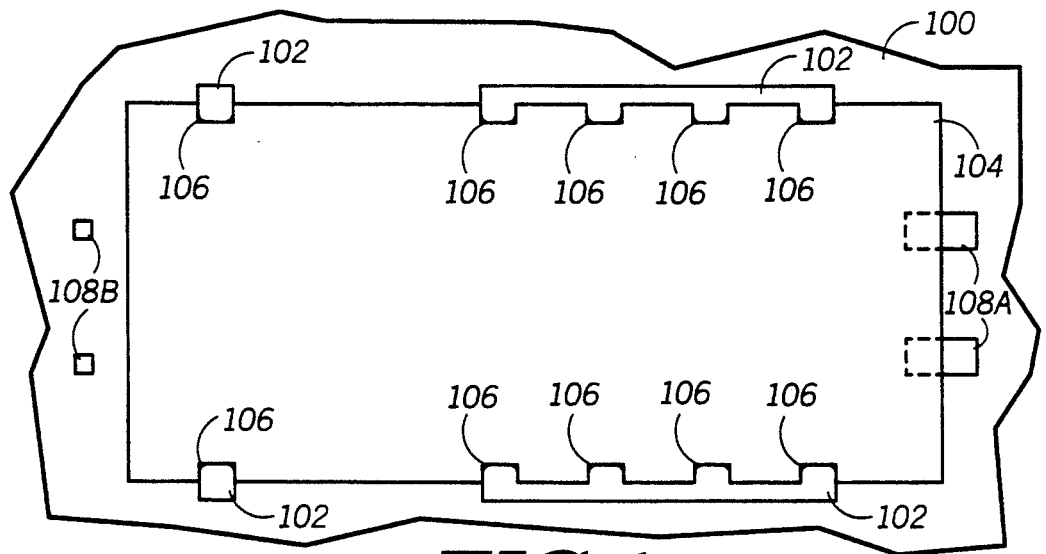
FIG. 1 is a top plan view of a housing with a retaining means and a circuit supporting substrate prior to engagement, according to a first embodiment of the present invention.
Figure 2:
FIG. 2 is a side view of the housing of FIG. 1.

Referring to FIG. 1, a top plan view of a housing 100 with a retaining means 102 and a circuit supporting substrate 104 (e.g., printed circuit board), arrangement is shown, in accordance with a first embodiment of the present invention. FIG. 2 illustrates a side view corresponding to FIG. 1. In this embodiment, the retaining means 102 comprises a series of molded-in tabs 102, which match a corresponding series of notches 106 on the circuit supporting substrate 104. The tabs 102 serve to substantially secure the vertical movement of the circuit supporting substrate 104 after engagement, as will be more fully hereinafter discussed. Additionally, retaining stops 108A and 108B, in combination with the tabs 102, serve to substantially secure the lateral movement of the circuit supporting substrate 104 after engagement.

Figure 3:
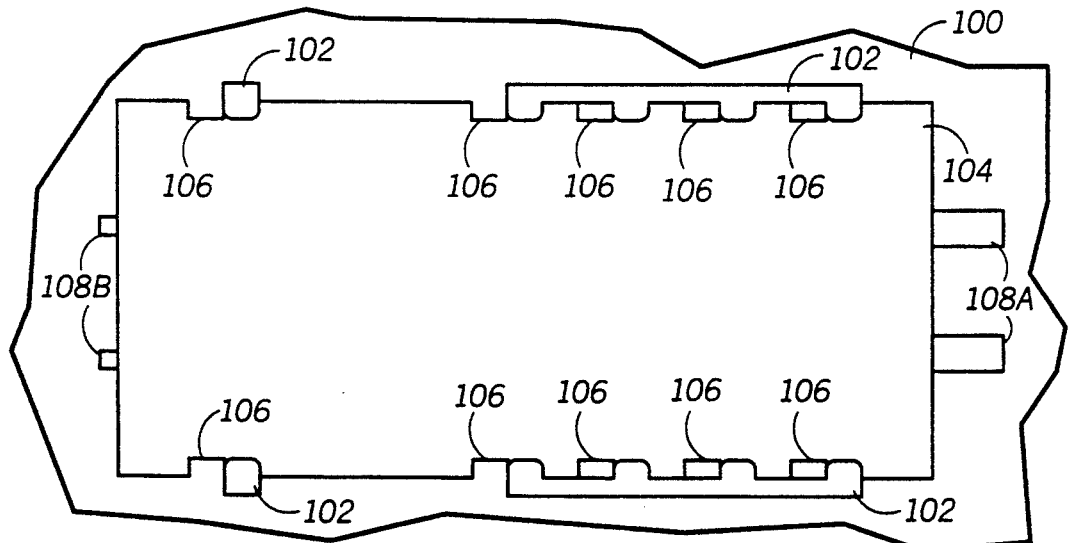
FIG. 3 is a top plan view of FIG. 1's housing with retaining means and circuit supporting substrate after engagement.
Figure 4:
FIG. 4 is a side view of FIG. 3.

To effect engagement, the notches 106 of the circuit supporting substrate 104 are located over the matching tabs 102. In this position, one end of the circuit supporting substrate 104 overlaps the retaining stop 108A, such that when pressed down the circuit supporting substrate 104 partially flexes (deflects) at one end over the retaining stop 108A (see FIG. 2). Once in position, the circuit supporting substrate 104 is slid toward the opposing retaining stop 108B, thereby engaging the tabs 102 over the circuit supporting substrate 104 (as shown in FIG. 3 and corresponding side view in FIG. 4). A radius on the leading edge of the tabs 102 may assist the engagement process. After the circuit supporting substrate 104 is slid sufficiently to snap down its partially flexed end from the retaining stop 108A, the circuit supporting substrate 104 is effectively secured.

The circuit supporting substrate 104 may be subsequently removed from the housing 100 by pulling up on the designated deflecting end of the circuit supporting substrate 104 and sliding until the deflecting end is partially flexed over the retaining stop 108A. When the tabs 102 are located over the matching notches 106 on the circuit supporting substrate 104, the circuit supporting substrate 104 is effectively disengaged (released) from the retaining means 102.

Optionally, a compression means, such as provided by elastomer strips 110 along the housing wall and adjacent to the circuit supporting substrate 104 and tabs 102 may additionally secure the circuit supporting substrate 104 to the housing 100 upon engagement. These elastomer strips 110 are compressed during assembly and maintain an upward securing force on the circuit supporting substrate 104.

In this way, the circuit supporting substrate 104 may be retained and secured to the housing 100 without requiring fasteners or additional hardware. The insertion and withdrawal of the circuit supporting substrate 104 is essentially fast and efficient, thereby circumventing the drawbacks experienced with the conventional housing 100 retaining arrangements.

Figure 5:
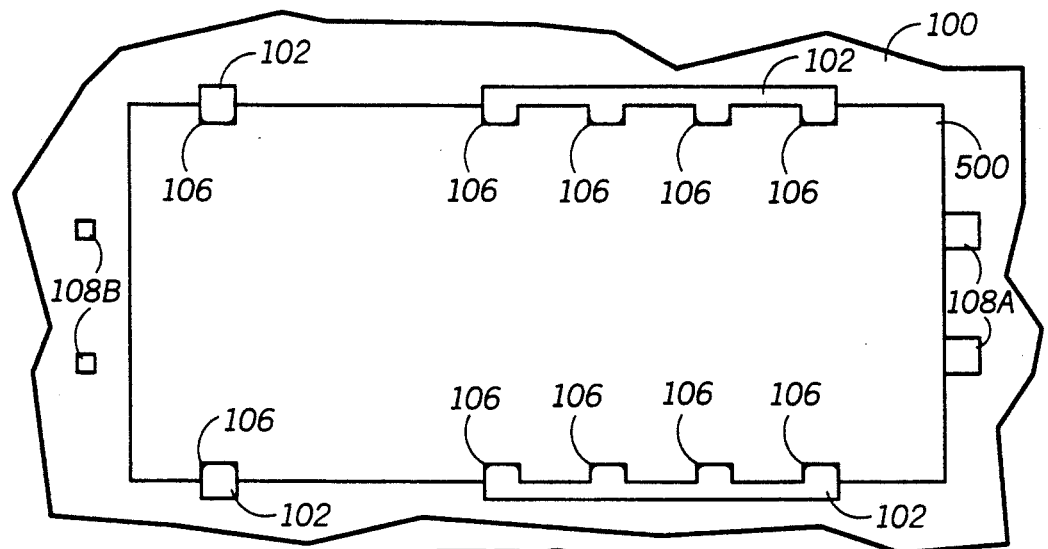
FIG. 5 is a top plan view of a housing with a retaining means and a circuit supporting substrate prior to engagement, according to a second embodiment of the present invention.
Figure 6:
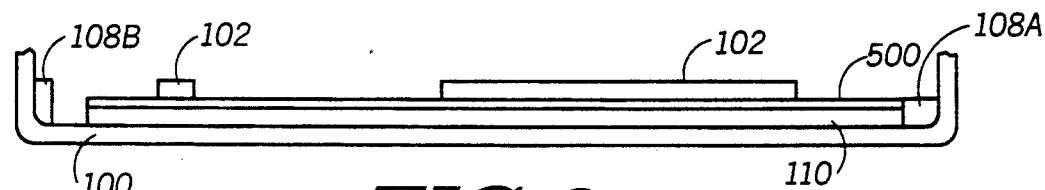
FIG. 6 is a side view of the housing of FIG. 5.
Figure 7:
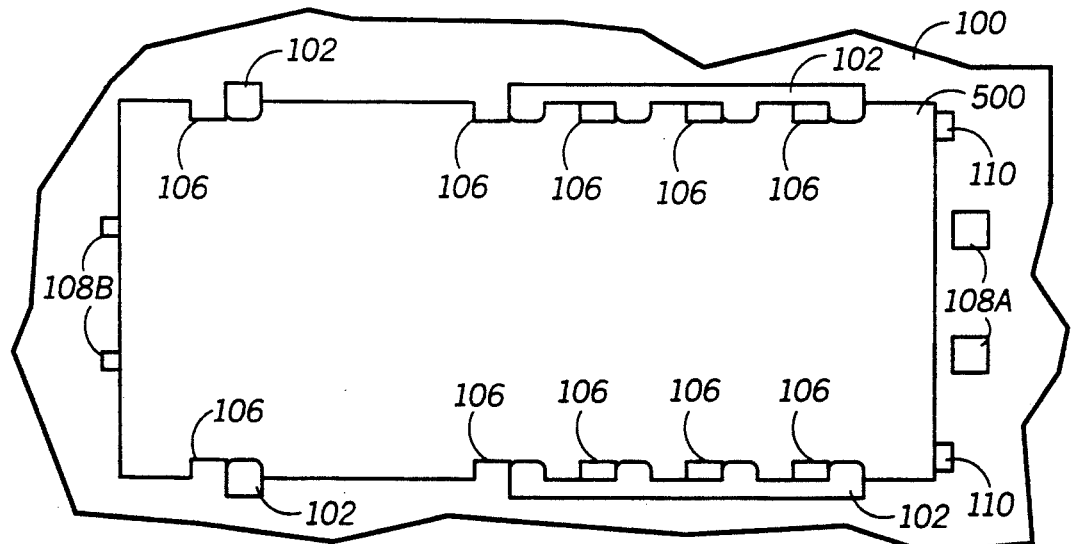
FIG. 7 is a top plan view of FIG. 5's housing with retaining means and circuit supporting substrate after engagement.
Figure 8:
FIG. 8 is a side view of FIG. 7.

Referring to FIG. 5, a top plan view of another embodiment of the present invention is shown. FIG. 6 illustrates a side view corresponding to FIG. 5. In this embodiment, the circuit supporting substrate 500 is dimensioned slightly smaller than the circuit supporting substrate 104, such that when the notches 106 of the circuit supporting substrate 500 are located over the matching tabs 102, the circuit supporting substrate 500 does not overlap the retaining stop 108A. However, the elastomer strips 110 are compressed when the circuit supporting substrate 500 is pressed down. Once in position, the circuit supporting substrate 500 is slid toward the opposing retaining stop 108B, thereby engaging the tabs 102 over the circuit supporting substrate 500 (as shown in FIG. 7 and corresponding side view in FIG. 8). The elastomer strips 110 contribute an upward securing force on the circuit supporting substrate 500 and the tabs 102.

The circuit supporting substrate 500 may be subsequently removed from the housing 100 by pressing down on the circuit supporting substrate 500 and sliding toward the retaining stop 108A. When the tabs 102 are located over the matching notches 106 on the circuit supporting substrate 500, the circuit supporting substrate 104 is effectively disengaged (released) from the retaining means 102.

We claim:

1. An electronic device, comprising:
   a circuit supporting substrate capable of being partially flexed at one end; and
   a housing having retaining means for receiving the circuit supporting substrate into the retaining means in a first direction and for securing the circuit supporting substrate within the retaining means via fastenerless sliding engagement in a second direction, the retaining means including at least one retaining stop arranged such that the one end of the circuit supporting substrate contacts the at least one retaining stop to partially flex the circuit supporting substrate at the one end while the circuit supporting substrate is received in the retaining means.

2. The electronic device of claim 1, further comprising compression means for compressibly securing the circuit supporting substrate to the housing.

3. The electronic device of claim 1, wherein the retaining means includes first and second retaining stops arranged such that the one end of the circuit supporting substrate contacts the first retaining stop to partially flex the circuit supporting substrate at the one end while being received, and the first and second retaining stops serve to substantially secure the lateral movement of the circuit supporting substrate upon fastenerless sliding engagement.

4. The electronic device of claim 1, wherein the second direction is substantially perpendicular to the first direction.

5. An electronic device, comprising:
   a circuit supporting substrate;
   a housing having retaining means for receiving the circuit supporting substrate into the retaining means in a first direction and for securing the circuit supporting substrate within the retaining means via fastenerless sliding engagement in a second direction; and
   compression means coupled to the housing, the circuit supporting substrate compressing the compression means while receiving the circuit supporting substrate in the retaining means, for compressibly securing the circuit supporting substrate to the housing.

6. A method of securing a circuit supporting substrate to a housing with retaining means and compression means, comprising the steps of:
   positioning a circuit supporting substrate over a retaining means;
   inserting the circuit supporting substrate into the retaining means in a first direction, the circuit supporting substrate compressing the compression means while being inserted into the retaining means;
   slidably engaging the circuit supporting substrate to the housing by sliding the circuit supporting substrate in a second direction; and
   compressibly securing the circuit supporting substrate to the housing with the compression means.

7. The method of claim 6, wherein the inserting step comprises the step of partially flexing the circuit supporting substrate.

8. An electronic device, comprising:
   a circuit supporting substrate capable of being partially flexed at one end, the circuit supporting substrate having a plurality of notches located about two opposing edges thereof;
   a housing for coupling the circuit supporting substrate thereto; and
   a retainer coupled to the housing for receiving the circuit supporting substrate into the retainer in a first direction and for securing the received circuit supporting substrate within the retainer via fastenerless sliding engagement in a second direction,
   the retainer including at least one retaining stop and a plurality of tabs arranged such that the one end of the circuit supporting substrate contacts the at least one retaining stop and the plurality of tabs matches with the plurality of notches for receiving the circuit supporting substrate in the retainer, and
   the circuit supporting substrate partially flexes at the one end contacting the at least one retaining stop while receiving the circuit supporting substrate in the retainer.

* * * * *